United States Patent [19]

Yamada et al.

[11] Patent Number: 5,208,173
[45] Date of Patent: May 4, 1993

[54] METHOD OF MANUFACTURING NON-VOLATILE SEMICONDUCTOR MEMORY DEVICE

[75] Inventors: Seiji Yamada, Tokyo; Kiyomi Naruke, Yokohama, both of Japan

[73] Assignee: Kabushiki Kaisha Toshiba, Kawasaki, Japan

[21] Appl. No.: 672,631

[22] Filed: Mar. 20, 1991

[30] Foreign Application Priority Data

Mar. 20, 1990 [JP] Japan ................................. 2-68081

[51] Int. Cl.⁵ ..................... A01L 21/265; H01R 21/22
[52] U.S. Cl. ...................................... 437/43; 437/48; 437/154
[58] Field of Search .................. 437/43, 150, 154, 48, 437/52, 56; 357/23.5, 23.6; 365/145, 149

[56] References Cited

U.S. PATENT DOCUMENTS

| | | |
|---|---|---|
| 3,755,001 | 8/1973 | Kooi et al. |
| 4,732,869 | 3/1988 | Van Attekum et al. ............... 437/56 |
| 4,851,361 | 7/1989 | Schumann et al. ..................... 437/52 |
| 5,004,701 | 4/1991 | Motokawa ............................. 437/69 |
| 5,006,480 | 9/1991 | Chang et al. .......................... 437/52 |
| 5,008,738 | 4/1991 | Hattori ................................ 357/23.5 |
| 5,102,827 | 4/1992 | Chen et al. .......................... 437/190 |

FOREIGN PATENT DOCUMENTS

| | | |
|---|---|---|
| 0358246 | 9/1988 | European Pat. Off. ............... 437/56 |
| 2098321 | 7/1982 | France . |
| 57-49250 | 7/1982 | Japan . |
| 0074669 | 9/1983 | Japan ..................................... 437/48 |
| 61-55965 | 3/1986 | Japan . |
| 63-25980 | 2/1988 | Japan . |
| 0116422 | 5/1988 | Japan ................................... 437/931 |
| 3905634 | 8/1989 | Japan ................................. 357/23.6 |
| 2-23651 | 1/1990 | Japan . |
| 2206446A | 1/1989 | United Kingdom . |
| 8101483 | 11/1980 | World Int. Prop. O. ............ 437/45 |

*Primary Examiner*—Olik Chaudhuri
*Assistant Examiner*—Loc Q. Trinh
*Attorney, Agent, or Firm*—Banner, Birch, McKie & Beckett

[57] ABSTRACT

The present invention provides a method of manufacturing a nonvolatile semiconductor memory device. In the method of the present invention. Arsenic ions are implanted into an element region of a silicon substrate so as to form a first impurity region. Then, an insulating film is formed on the silicon substrate in the element region, followed by forming a heat resistant film on the entire surface of the silicon substrate. Further, a resist film is formed on the silicon substrate, followed by patterning the resist film to form an opening on at least the first impurity region. After the patterning step, the heat resistant film positioned below the opening of the resist film is removed, followed by implanting phosphorus ions into the substrate using the patterned resist film as a mask so as to form a second impurity region. In the next step, the resist film is removed and, then, annealing is applied with the heat resistant film used as a mask. After the annealing step, the resist film is removed, and an annealing is performed with the heat resistant film used as a mask, followed by removing the insulating film using the heat resistant film as a mask. Finally, a tunnel oxide film is formed on that portion of the silicon substrate, followed by forming an electrode on the tunnel oxide film so as to manufacture a desired nonvolatile semiconductor memory device.

16 Claims, 9 Drawing Sheets

METHOD OF MANUFACTURING NON-VOLATILE SEMICONDUCTOR MEMORY DEVICE

BACKGROUND OF THE INVENTION

1. Field of the Invention

The present invention relates to a FLOTOX type EEPROM, particularly, to an improvement in a method of manufacturing a thin oxide film, hereinafter referred to as "tunnel oxide film", through which flows a Fowler-Nordheim current in a programming stage of information.

2. Description of the Related Art

Figure 1:
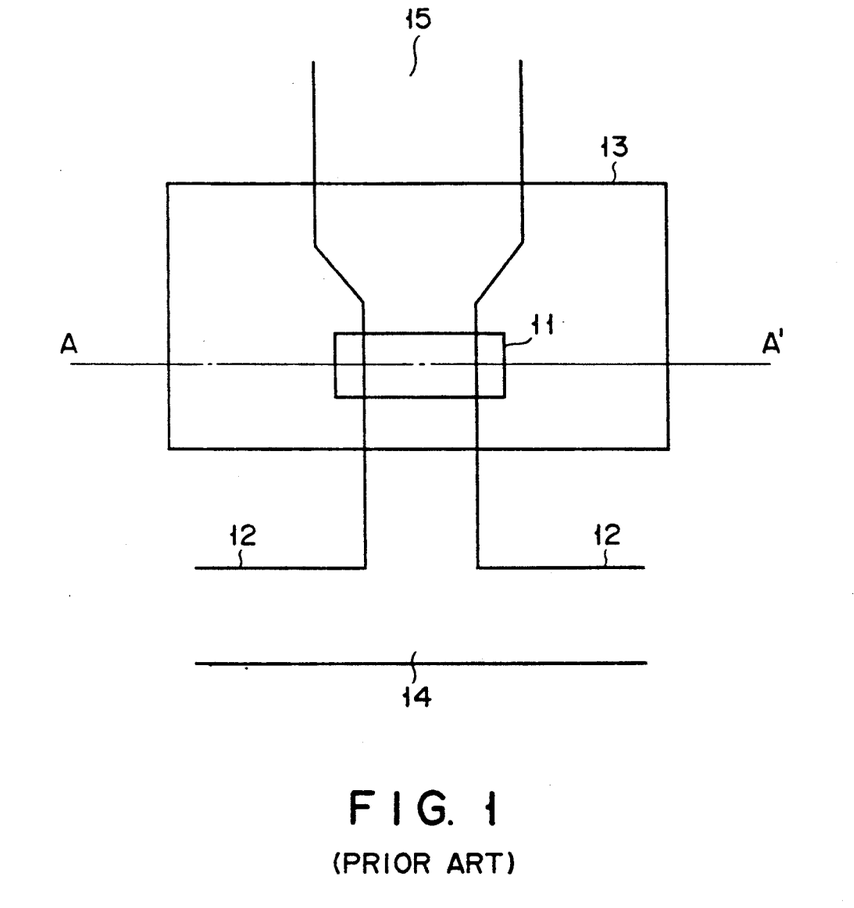
FIG. 1 is a plan view showing a FLOTOX type EEPROM in which the tunnel region overlaps with the edge portion of the field oxide film.

In accordance with a marked progress achieved in recent years in the miniaturization of the memory cell of FLOTOX type EEPROM, a tunnel region in which a tunnel oxide film is formed tends to be formed such that the edge portion of the tunnel region overlaps with the adjacent field oxide film, as shown in FIG. 1. Incidentally, FIG. 1 is a plan view showing a single memory cell comprising a tunnel region 11, a field oxide film 12, a floating gate 13, a source region 14 and a drain region 15.

FIGS. 2A to 2D are cross sectional views along the line A—A' shown in FIG. 1, showing a conventional method of forming a tunnel oxide film of a memory cell in the case where the tunnel region overlaps with the edge portion of the field oxide film as shown in FIG. 1.

Figure 2A:
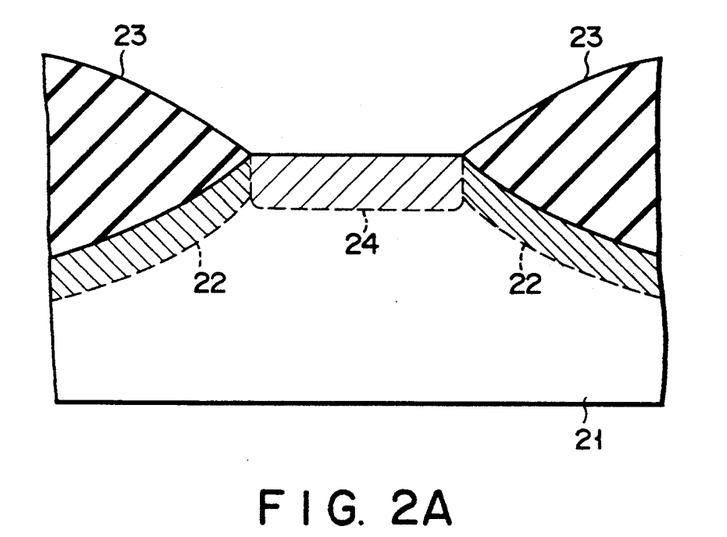
FIGS. 2A to 2D are cross sectional views collectively showing the method of manufacturing a conventional nonvolatile semiconductor memory device.
Figure 2B:
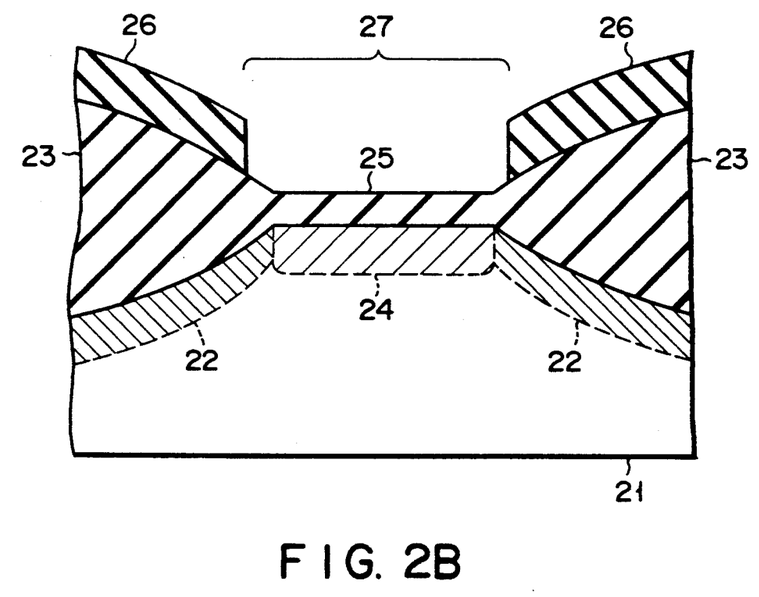

In the first step, a channel stop 22 is formed in a p-type silicon substrate 21 by selectively implanting, for example, boron ions, as shown in FIG. 2A. A field oxide film 23 serving to isolate element regions is formed on the channel stop 22. Then, impurity ions, e.g., As ions, are implanted into the silicon substrate 21 within a tunnel region so as to form an n-type impurity region 24 within the silicon substrate 21 in the tunnel region. After formation of the n-type impurity region 24, a relatively thick oxide film 25 having a thickness of about 400 Å is formed over the entire element region, followed by coating the entire silicon substrate 21 with a resist film 26, as shown in FIG. 2B. In the next step, the resist film 26 is exposed to light and, then, patterned such that the resist film 26 is selectively removed from a tunnel region 27. It should be noted that the tunnel region 27 is positioned to overlap with the edge portion of the field oxide film 23. The particular construction is advantageous in terms of miniaturization of the element.

Figure 2C:
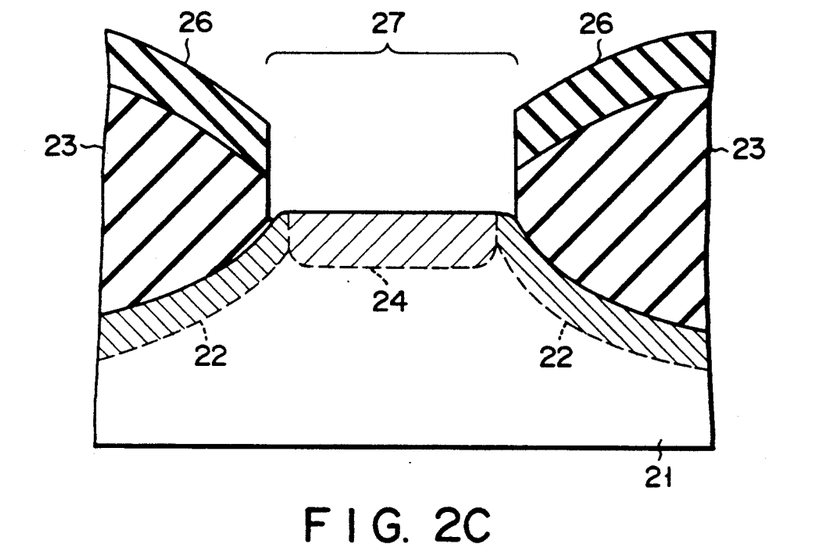
Figure 2D:
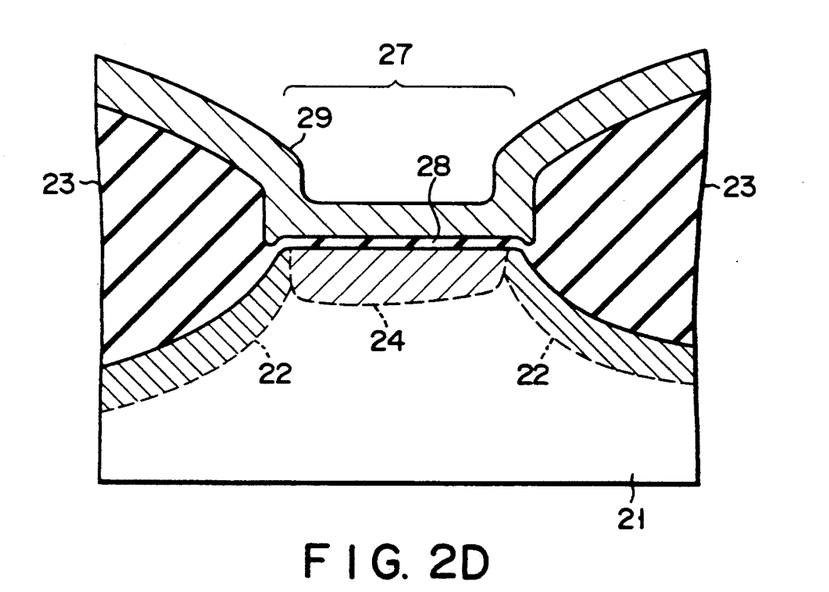

Then, the oxide film 23 positioned in the tunnel region 27 is etched with $NH_4F$ using the resist film 26 as a mask, as shown in FIG. 2C. Further, the resist film 26 is removed, followed by forming a relatively thin tunnel oxide film 28 having a thickness of about 100 Å by, for example, thermal oxidation in the tunnel region 27, as shown in FIG. 2D. Still further, a polysilicon film about 4000 Å thick is formed on the tunnel oxide film 28, followed by patterning the polysilicon film so as to form a floating gate 29.

In the conventional method described above, the tunnel region 27 is positioned to overlap with the field oxide film 23, giving rise to a difficulty. Specifically, in the step of etching the oxide film 25 in the tunnel region 27 in preparation for the formation of the tunnel oxide film 28, the edge portion of the field oxide film 23 is etched together, leading to recession in the edge of the field oxide film 23. It follows that the channel stop 22 is partially exposed to the substrate surface, as shown in FIG. 2C. This brings about a serious problem. Specifically, even if a high voltage is applied to the n-type impurity region 24 for withdrawing electrons from the floating gate 29 in the programming step of information, the holes formed by the band-to-band tunneling within the n-type impurity region 24 leak into the silicon substrate 21 through the channel stop 22. In other words, it is difficult to apply an electric field of high intensity to the tunnel oxide film 28, making it difficult to permit flow of Fowler-Nordheim current.

SUMMARY OF THE INVENTION

An object of the present invention is to overcome the above-noted difficulties inherent in the prior art. Specifically, the present invention relates to a method of manufacturing a nonvolatile semiconductor memory device in which the tunnel region is positioned to overlap with the edge portion of the field oxide film, and is intended to achieve the device construction which permits preventing the hole leakage in the programming stage of information so as to facilitate a high voltage application to the tunnel oxide film. The present invention is also intended to improve the quality of the tunnel oxide film.

In the method of the present invention, which permits achieving the objects noted above, a silicon substrate is divided into an element region and a field region. Arsenic ions are implanted into the element region of the silicon substrate so as to form a first impurity region. Then, an insulating film is formed on the silicon substrate in the element region, followed by forming a heat resistant film on the entire surface of the silicon substrate. After formation of the heat resistant film, a resist film having an opening on at least the first impurity region is formed on the silicon substrate, followed by removing the heat resistant film positioned in the opening of the resist film. In the next step, phosphorus ions are implanted into the silicon substrate using the resist film as a mask so as to form a second impurity region. Further, the resist film is removed and, then, annealing is applied with the heat resistant film used as a mask. After the annealing step, the insulating film is removed with the heat resistant film used as a mask. Finally, a tunnel oxide film is formed on that portion of the silicon substrate from which the insulating film has been removed, followed by forming electrodes on the insulating film, the heat resistant film and the tunnel oxide film so as to manufacture a desired nonvolatile semiconductor memory device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Some embodiments of the present invention are shown in the accompanying drawings. Incidentally, common members or the like of the device shown in the drawings are denoted by the common reference numerals throughout the drawings.

Figure 3A:
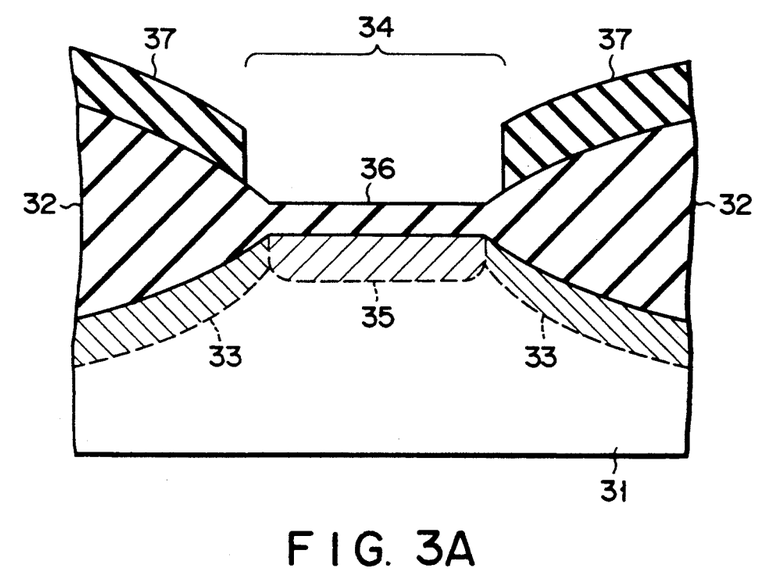
FIGS. 3A to 3D are cross sectional views collectively showing a method of manufacturing a nonvolatile semiconductor memory device according to a first embodiment of the present invention.

First of all, FIGS. 3A to 3D collectively show a method of manufacturing a nonvolatile semiconductor memory device according to a first embodiment of the present invention. As shown in FIG. 3A, a field oxide film 32 and a channel stop 33 are formed on a p-type silicon substrate 31 by the conventional process. Also, an n-type impurity region 35 is formed in an element region including a tunnel region 34. Further, a relatively thick oxide film 36, i.e., about 400 Å thick, is formed by thermal oxidation on the silicon substrate 31 in the element region. Then, a photoresist film 37 is formed by coating above the entire region of the silicon substrate 31, followed by exposing the resist film 37 to light and, then, patterning the resist film 37. As a result, an opening is formed in the resist film 37 in the region facing the tunnel region 34.

Figure 3B:
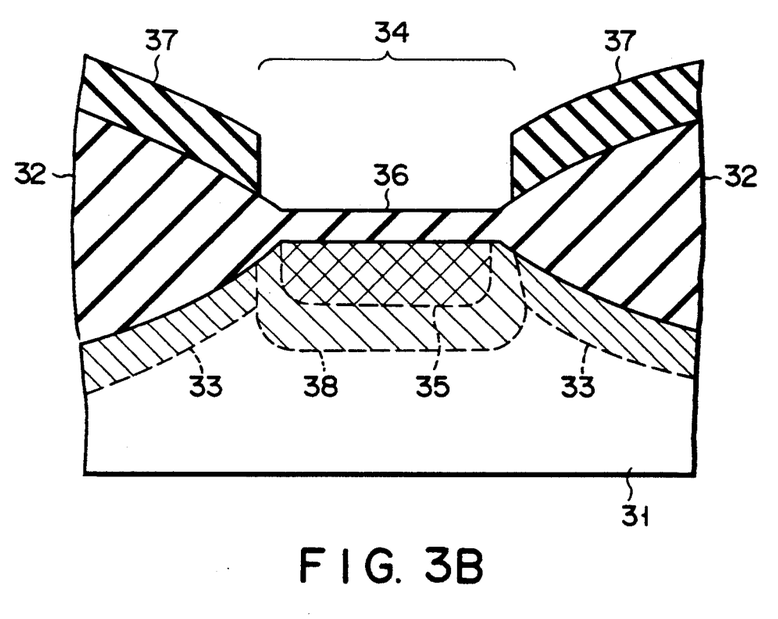
Figure 3C:
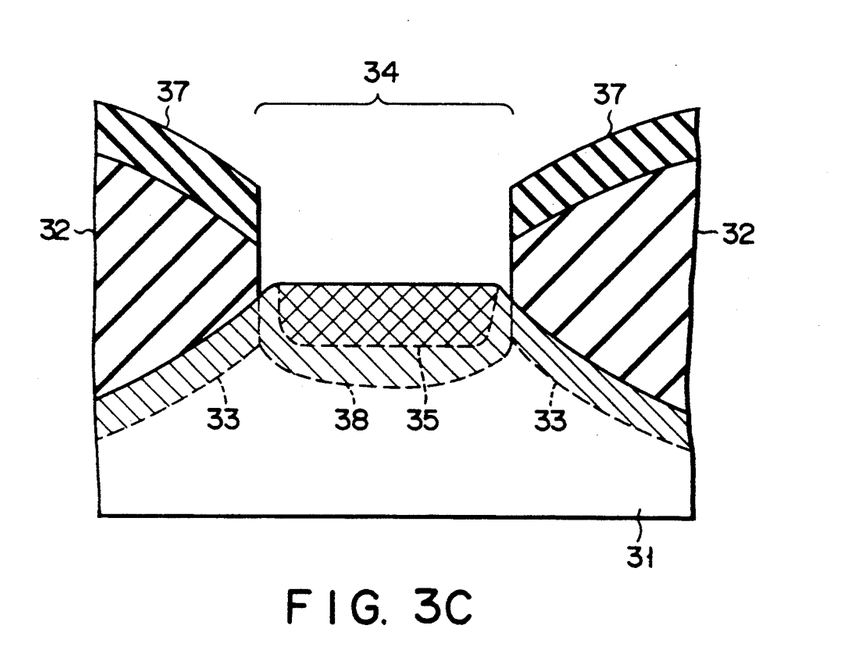

In the next step, ions of an n-type impurity, e.g., phosphorus, are implanted into the silicon substrate 31 in the tunnel region 34 in a concentration equal to or higher than the impurity concentration of the impurity region 35 so as to form an n-type impurity region 38, as shown in FIG. 3B. It should be noted that damages are formed in the oxide film 36 in the step of implanting the phosphorus ions into the silicon substrate 31. After formation of the n-type impurity region 38, the oxide film 36 positioned in the tunnel region 34 is etched with NH$_4$F using the resist film 37 as a mask, as shown in FIG. 3C. In this step, the edge portion of the field oxide film 32 is also etched, leading to recession of the field oxide film in the edge portion. It should be noted, however, that the presence of the impurity region 38 prevents the channel stop 33 from being exposed to the substrate surface.

Figure 3D:
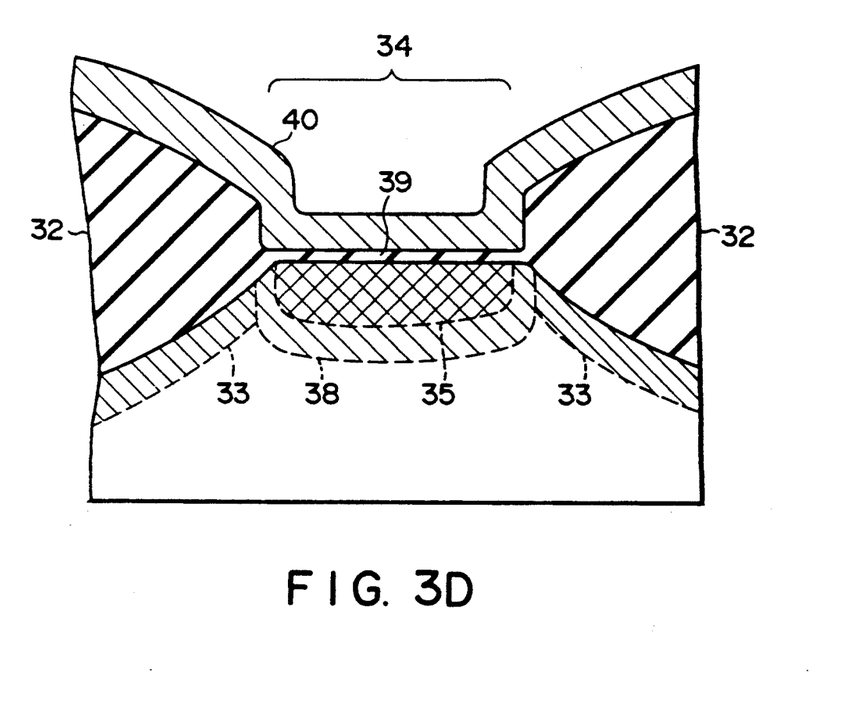

In the next step, the resist film 37 is removed, followed by forming a relatively thin tunnel oxide film 39, i.e., about 100 Å thick, in the tunnel region 34, as shown in FIG. 3D. Then, a polysilicon film having a thickness of about 4000 Å is formed on the entire surface of the silicon substrate 31 by means of, for example, CVD. Finally, a floating gate 40 is formed by patterning the polysilicon film so as to manufacture a desired nonvolatile semiconductor memory device.

In the method described above, the oxide film 36 having damages formed therein is removed, and the tunnel oxide film 39 is newly formed. Naturally, the tunnel oxide film 39 exhibits stable characteristics. What should also be noted is that the impurity region 38 serves to prevent the channel stop 33 from being exposed to the substrate surface, as described previously. The particular construction permits producing a prominent effect, as shown in FIG. 4A.

Figure 4A:
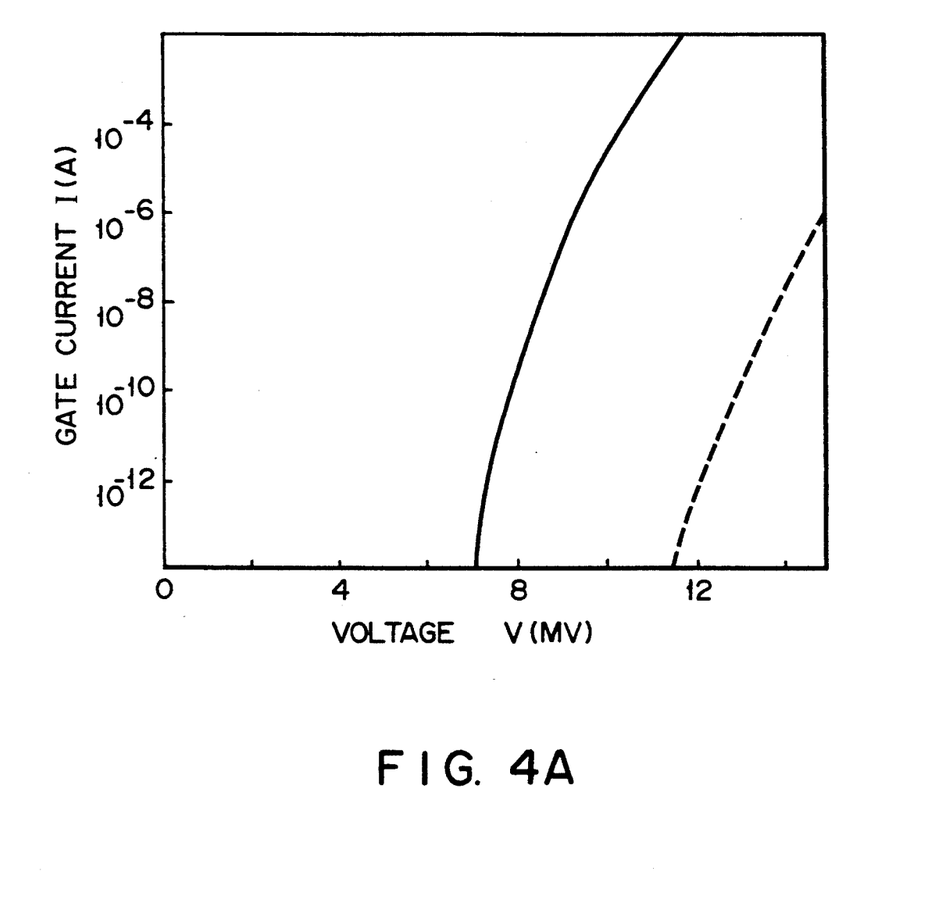
FIG. 4A is a graph showing the relationship between the gate current and the electric field intensity with respect to nonvolatile semiconductor memory devices manufactured by the method of the present invention and by the conventional method.
Figure 4B:
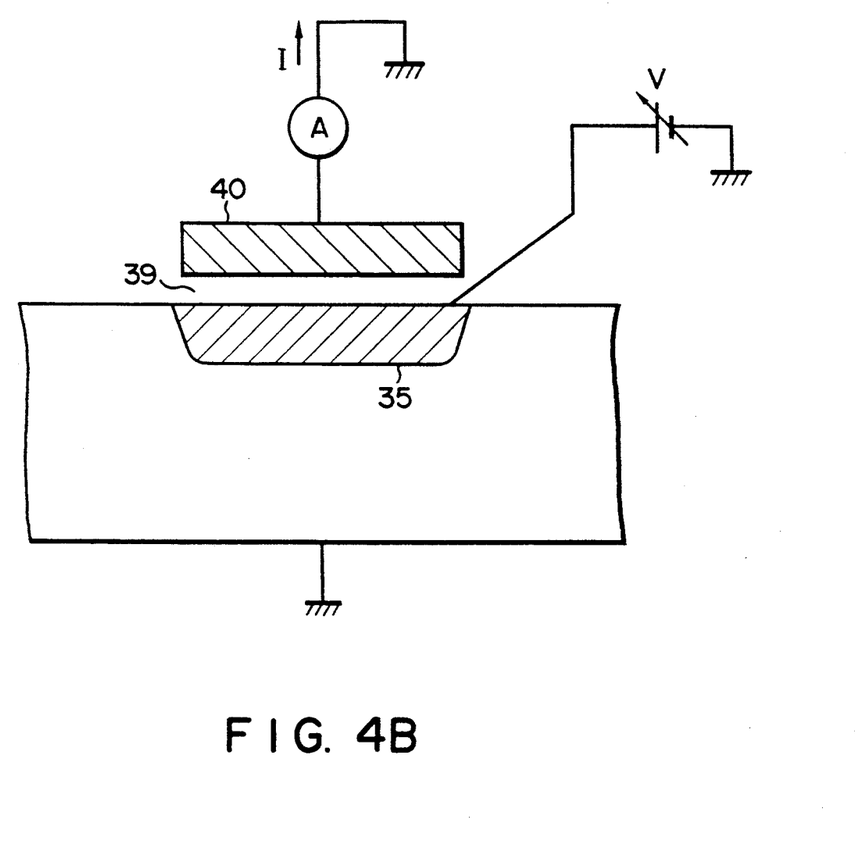
FIG. 4B shows a circuit diagram employed for measuring the V-I characteristics.

Specifically, FIG. 4A is a graph showing the V-I characteristics with respect to nonvolatile semiconductor memory devices manufactured by the method of the present invention and by the conventional method. The solid line shown in FIG. 4A denotes the characteristics of the device manufactured by the method of the present invention, with the broken line denoting the characteristics of the device manufactured by the conventional method. On the other hand, FIG. 4B shows a circuit diagram employed for measuring the V-I characteristics. As shown in the drawing, the floating gate 40 formed on the tunnel oxide film 39 having a thickness of 100 Å is connected to the ground, and the voltage V applied to the impurity region 35 is used as a parameter.

As apparent from FIG. 4A, the gate current I of the device manufactured by the method of the present invention is markedly larger than that of the device manufactured by the conventional method in the case where the same voltage is applied to the tunnel oxide film 39. This supports that the device manufactured by the method of the present invention permits sufficiently suppressing the leakage holes formed by the band-to-band tunneling. It follows that a large tunnel current can be obtained with a relatively low voltage in the present invention, making it possible to perform programming of information efficiently.

Figure 5A:
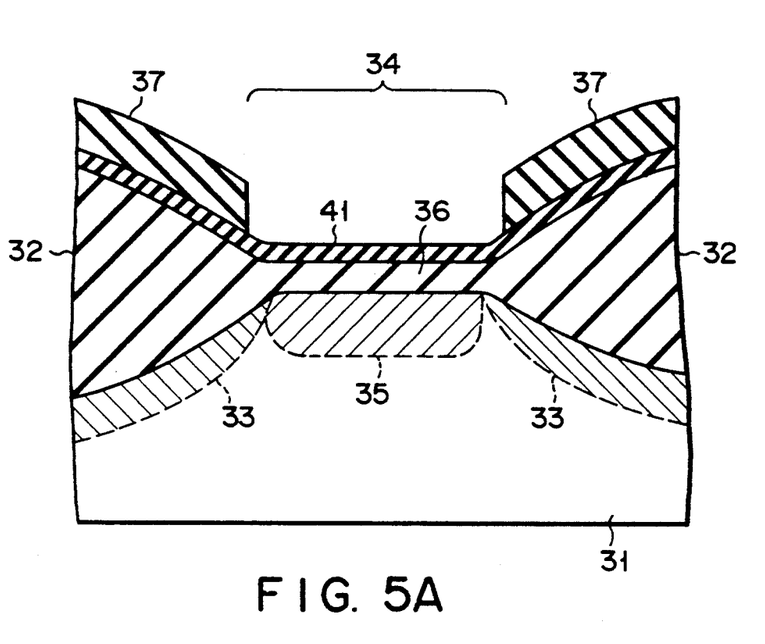
FIGS. 5A to 5D are cross sectional views collectively showing a method of manufacturing a nonvolatile semiconductor memory device according to a second embodiment of the present invention.

FIGS. 5A to 5D collectively show a method of manufacturing a nonvolatile semiconductor memory device according to a second embodiment of the present invention. In the first step, a field oxide film 32 and channel stop 33 are formed on a p-type silicon substrate 31 by the known process, as shown in FIG. 5A. Also, an n-type impurity region 35 is formed in an element region including a channel region 34. Then, a relatively thick oxide film 36 having a thickness of about 400 Å is formed on the silicon substrate 31 in the element region by thermal oxidation. After formation of the oxide film 36, a heat resistant film 41, e.g., a silicon nitride film, having a thickness of about 80 Å is formed above the entire surface of the silicon substrate 31 by chemical vapor deposition, followed by coating the heat resistant film 41 with a resist film 37. Further, the resist film 37 is exposed to light and, then, patterned so as to form an opening in the resist film 37 so as to expose the channel region 34 to the outside.

Figure 5B:
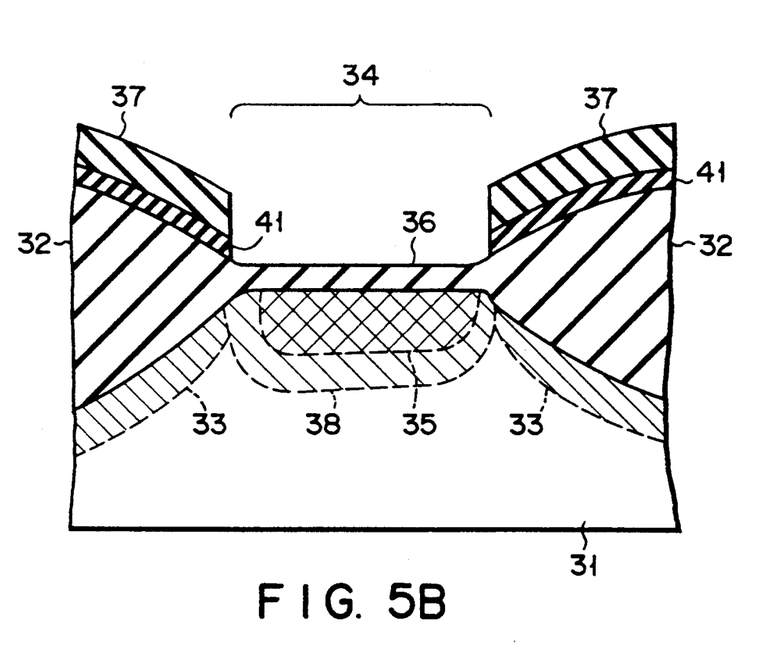

In the next step, the heat resistant film 41 in the tunnel region 34 is etched with NH$_4$F using the resist film 37 as a mask, as shown in FIG. 5B. Further, impurity ions, e.g., phosphorus ions, are implanted into the silicon substrate 11 in the tunnel region 34 using the resist film 37 as a mask, so as to form an n-type impurity region 38 within the silicon substrate 31 in the tunnel region 34. The impurity concentration implanted into the substrate should be equal to or higher than that of the impurity region 35. It should be noted that damages are formed in the oxide film 36 in the step of implanting the phosphorus ions into the substrate 31.

Figure 5C:
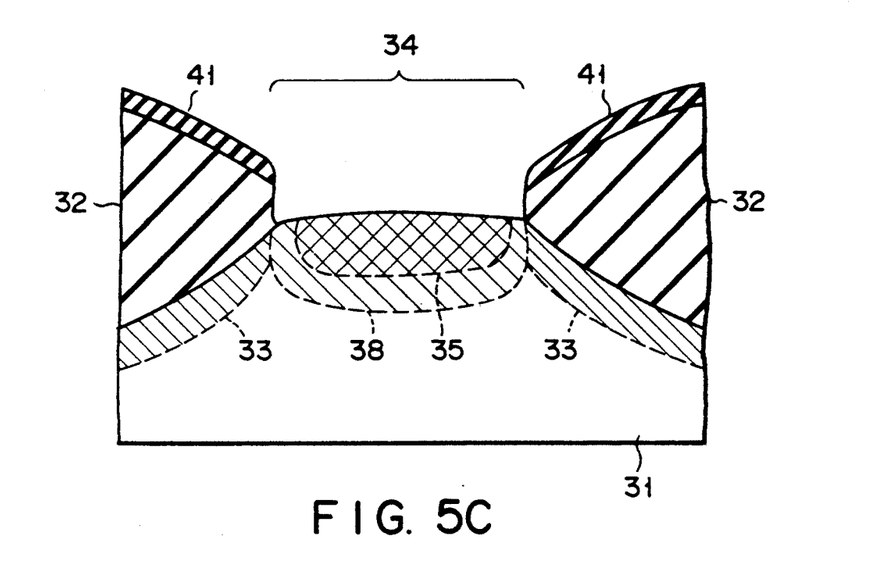

Further, the resist film 37 is removed, followed by performing an annealing treatment under a nitrogen gas atmosphere at 950° C. for about 30 minutes so as to make up for the damage done to the substrate 31 and the oxide film 35 by the phosphorus ion implantation, as shown in FIG. 5C. After the annealing treatment, the oxide film 36 within the tunnel region 34 is etched with NH$_4$F using the heat resistant film 41 as a mask. In this etching step, the edge portion of the field oxide film 32 is also etched away. However, the presence of the impurity region 38 serves to present the channel stop 33 from being exposed to the substrate surface.

Figure 5D:
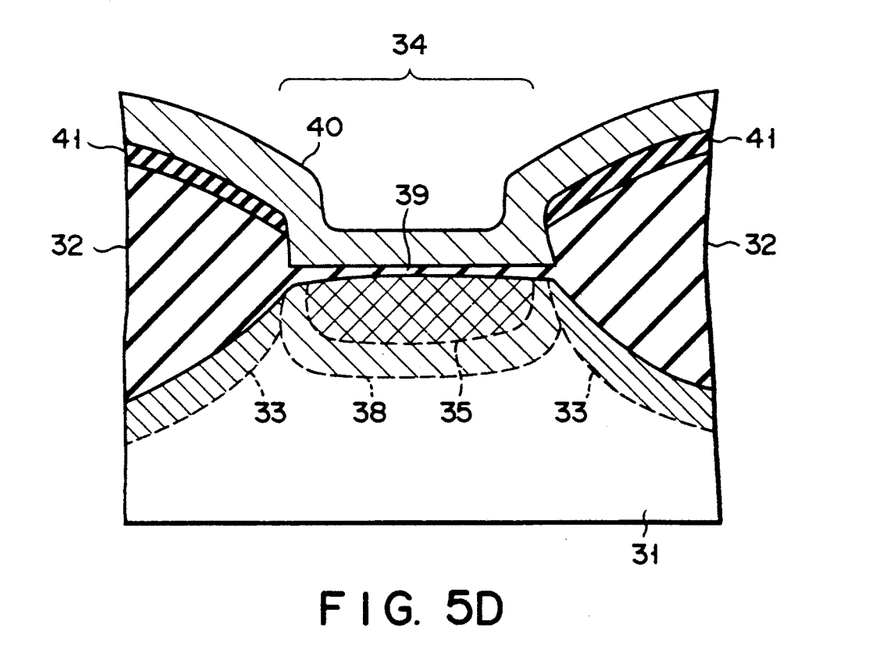

In the next step, a relatively thin tunnel oxide film 39 having a thickness of about 100 Å is formed in the tunnel region 34, as shown in FIG. 5D. Then, a polysilicon film is formed in a thickness of about 4000 Å above the entire region of the silicon substrate 31 by means of, for example, CVD method. Finally, the polysilicon film is patterned so as to form a floating gate 40.

In the method described above, the heat resistant film 41 is formed on the oxide film 36. Also, an annealing treatment is applied after formation of the impurity region 38. As a result, it is possible to eliminate the damage done to the substrate 31 and the oxide film 36 by the phosphorus ion implantation. It should also be noted that the tunnel oxide film 39 is formed after the annealing step, with the result that the tunnel oxide film 39 is highly stable in its quality. It follows that the nonvolatile semiconductor memory device manufactured by the method according to the second embodiment of the present invention exhibits a reliability higher than that of the device manufactured by the method according to the first embodiment of the present invention.

In each of the first and second embodiments described above, the tunnel region 34 is positioned to overlap with the edge portion of the field oxide film 32. However, it is possible for the tunnel region 34 to be positioned within the element region. In this case, it is possible to apply the technical idea of the present invention in view of the case where a deviation in the masking step causes the tunnel region 34 to be positioned to overlap with the edge portion of the field oxide film 32. If the technical idea of the present invention is applied to such a case, it is possible to obtain the effect similar to that obtained in each of the first and second embodiments described above.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a non-volatile semiconductor memory device having a floating gate for storing data, the method comprising the steps of:
    preparing a semiconductor substrate;
    selectively implanting ions of a fist impurity into said semiconductor substrate to form a channel stop;
    forming a field oxide film on said channel stop to define an element region;
    implanting ions of a second impurity into said semiconductor substrate at said element region to form a first impurity region for receiving a voltage to generate a tunnel current between said first impurity region and said floating gate;
    forming a gate insulating film on said element region;
    forming a mask on the result structure;
    patterning the mask to form an opening at a tunnel region over said first impurity region and extending at least partially over said field oxide film;
    implanting ions of a third impurity into said semiconductor substrate at said tunnel region using the patterned mask to form a second impurity region;
    exposing a surface of said semiconductor substrate at said tunnel region by removing the gate insulating film at said tunnel region and the portion of said field oxide film at said tunnel region, wherein said second impurity region prevents said channel stop from being exposed;
    removing said mask;
    forming a tunnel insulating film through which the tunnel current flows on the exposed surface of said semiconductor substrate; and
    forming the floating gate on said gate and tunnel insulating films.

2. The method according to claim 1, wherein the step of patterning the mask comprises patterning the mask to form an opening at a tunnel region over said first impurity region and extending over first and second opposed portions of said field insulating film.

3. The method according to claim 2, wherein the step of patterning the mask comprises patterning the mask to form an opening at a tunnel region over said first impurity region and extending over first and second opposed portions of said field insulating film.

4. The method of manufacturing a nonvolatile semiconductor memory device according to claim 2, wherein the impurity concentration of the second impurity region is equal to or higher than that of the first impurity region.

5. The method of manufacturing a nonvolatile semiconductor memory device according to claim 2, wherein the masking material consists of a photoresist film.

6. The method of manufacturing a nonvolatile semiconductor memory device according to claim 2, wherein the opening of the masking material is positioned within the element region.

7. The method of manufacturing a nonvolatile semiconductor memory device according to claim 2, wherein the first impurity is arsenic and the second impurity is phosphorus.

8. The method according to claim 1, wherein said tunnel oxide film is thinner than said gate oxide film.

9. The method according to claim 1, wherein the step of forming a mask comprises forming a photoresist film.

10. The method according to claim 1, wherein the step of implanting ions of a third impurity comprises implanting ions to form a second impurity region having an impurity concentration greater than or equal to an impurity concentration of said first diffusion region.

11. A method of manufacturing a non-volatile semiconductor memory device having a floating gate for storing data, the method comprising the steps of:
    preparing a semiconductor substrate;
    selectively implanting ions of a fist impurity into said semiconductor substrate to form a channel stop;
    forming a field oxide film on said channel stop to define an element region;
    implanting ions of a second impurity into said semiconductor substrate at said element region to form a first impurity region for receiving a voltage to generate a tunnel current between said first impurity region and said floating gate;
    forming a first insulating film on said element region;

forming a second insulating film on the resulting structure;

forming a mask on the second insulating film;

patterning the mask to form an opening at a tunnel region over said first impurity region and extending at least partially over said field oxide film;

removing the second insulating film at said tunnel region;

implanting ions of a third impurity into said semiconductor substrate at said tunnel region using the patterned mask to form a second impurity region;

removing the mask;

annealing the resulting structure using said second insulating film as a mask;

exposing a surface of said semiconductor substrate at said tunnel region by removing the gate insulating film at said tunnel region and the portion of said field oxide film at said tunnel region, wherein said second impurity region prevents said channel stop from being exposed;

forming a tunnel insulating film through which the tunnel current flows on the exposed surface of said semiconductor substrate; and forming the floating gate on said first, second, and tunnel insulating films.

12. The method according to claim 11, wherein the step of forming a mask comprises forming a photoresist film.

13. The method according to claim 11, wherein the step of implanting ions of a third impurity comprises implanting ions to form a second impurity region having an impurity concentration greater than or equal to an impurity concentration of said first diffusion region.

14. The method according to claim 11, wherein said tunnel oxide film is thinner than said gate oxide film.

15. The method according to claim 11, wherein the step of patterning the mask comprises patterning the mask to form an opening at a tunnel region over said first impurity region and extending over first and second opposed portions of said field insulating film.

16. A method of manufacturing a non-volatile semiconductor memory device having a floating gate for storing data, the method comprising the steps of:

forming a field oxide film on a channel stop in a semiconductor substrate of a first conductivity type to define an element region;

implanting ions of a first impurity of a second conductivity type into the semiconductor substrate in the element region to form a first impurity region for receiving a voltage to generate a tunnel current between said first impurity region and said floating gate;

forming a gate insulating film on the element region;

forming a masking material on the resulting structure;

patterning the masking material to form an opening over the first impurity region and extending at least partially over said field oxide film;

implanting ions of a second impurity of the second conductivity type into the semiconductor substrate using the patterned masking material as a mask to form a second impurity region;

exposing a surface of said semiconductor substrate at said tunnel region by removing the gate insulating film at said tunnel region and the portion of said field oxide film at said tunnel region, wherein said second impurity region prevents said channel stop from being exposed;

removing the masking material;

forming a tunnel insulating film through which the tunnel current flows on the surface of that portion of the semiconductor substrate from which the gate insulating film and the field oxide film have been removed; and forming the floating gate on the gate and tunnel insulating films.

* * * * *